US011881969B2

(12) United States Patent
Jose et al.

(10) Patent No.: US 11,881,969 B2
(45) Date of Patent: Jan. 23, 2024

(54) REAL-TIME DC-BALANCE AWARE AFE OFFSET CANCELLATION

(71) Applicant: Samsung Display Co., Ltd., Yongin (KR)

(72) Inventors: Anup P Jose, San Jose, CA (US); Sam Ray, Morgan Hill, CA (US); Ali Fazli Yeknami, San Jose, CA (US); Amir Amirkhany, Santa Clara, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/885,001

(22) Filed: Aug. 10, 2022

(65) Prior Publication Data

US 2023/0344681 A1 Oct. 26, 2023

Related U.S. Application Data (60) Provisional application No. 63/333,818, filed on Apr. 22, 2022.

(51) Int. Cl.
*H04L 25/02* (2006.01)
*H04L 25/03* (2006.01)
(Continued)

(52) U.S. Cl.
CPC ...... *H04L 25/0292* (2013.01); *H03M 1/1009* (2013.01); *H04L 25/028* (2013.01); *H04L 25/03878* (2013.01); *H04L 27/0002* (2013.01)

(58) Field of Classification Search
CPC ........... H04L 25/0292; H04L 25/03878; H04L 25/028; H04L 27/0002; H03M 1/1009
See application file for complete search history.

(56) References Cited

U.S. PATENT DOCUMENTS 3,967,204 A * 6/1976 Hansen ................. H03G 3/345
  381/2
5,537,079 A * 7/1996 Gosser ................. H03F 3/3066
  330/265

(Continued)

FOREIGN PATENT DOCUMENTS

CN 209913805 U 6/2019

OTHER PUBLICATIONS

Norimatsu, Takayasu, et al., "A 100-Gbps 4-Lane Transceiver for 47-dB Loss Copper Cable in 28-nm CMOS," IEEE Transactions on Circuits and Systems I: Regular Papers, IEEE, vol. 67, No. 10, Oct. 2020, 11 pages.

(Continued)

*Primary Examiner* — James M Perez
(74) *Attorney, Agent, or Firm* — Lewis Roca Rothgerber Christie LLP (57) ABSTRACT

A receiver for a serial data link, including an analog front end (AFE) including a continuous-time linear equalizer (CTLE) configured to receive an input signal from a transmitter, the CTLE including a first output node; a second output node; a plurality of programmable tail current sources configured to adjust a direct current (DC) offset between the first output node and the second output node; and a calibration circuit including: a slicer configured to output a difference between a first average output voltage corresponding to the first output node and a second average output, voltage corresponding to the second output node; and a calibration counter configured to increment or decrement an offset count based on the difference, wherein the plurality of programmable tail current sources are adjusted based on a value of the offset count.

22 Claims, 9 Drawing Sheets

(51) Int. Cl.
*H03M 1/10* (2006.01)
*H04L 27/00* (2006.01)

(56) References Cited

U.S. PATENT DOCUMENTS

| | | | | |
|---|---|---|---|---|
| 5,726,597 A * | 3/1998 | Petty | | H03F 3/45762 |
| | | | | 327/563 |
| 5,729,230 A * | 3/1998 | Jensen | | H03M 3/396 |
| | | | | 341/118 |
| 5,844,442 A * | 12/1998 | Brehmer | | H03F 3/45654 |
| | | | | 330/261 |
| 5,999,028 A * | 12/1999 | Knoch | | H03F 3/45771 |
| | | | | 326/29 |
| 6,798,827 B1 | 9/2004 | Phanse | | |
| 6,985,098 B2 * | 1/2006 | Lee | | H03F 1/304 |
| | | | | 341/126 |
| 6,985,711 B2 * | 1/2006 | Holenstein | | H04L 25/061 |
| | | | | 455/266 |
| 7,382,203 B2 * | 6/2008 | Kang | | H03K 3/015 |
| | | | | 331/185 |
| 8,174,416 B2 * | 5/2012 | Sebastiano | | H03F 1/304 |
| | | | | 341/118 |
| 8,319,553 B1 * | 11/2012 | Ivanov | | H03F 3/456 |
| | | | | 330/253 |
| 8,335,249 B1 * | 12/2012 | Su | | H03F 3/45197 |
| | | | | 375/232 |
| 8,339,195 B2 * | 12/2012 | Lee | | G11C 29/028 |
| | | | | 330/307 |
| 8,390,374 B2 * | 3/2013 | Alexander | | H03F 3/45475 |
| | | | | 330/147 |
| 8,552,788 B2 * | 10/2013 | Ivanov | | H03F 3/45928 |
| | | | | 327/333 |
| 8,791,735 B1 * | 7/2014 | Shibasaki | | H04L 7/0337 |
| | | | | 327/147 |
| 8,837,626 B2 * | 9/2014 | Malipatil | | H04L 25/03159 |
| | | | | 375/259 |
| 8,958,512 B1 * | 2/2015 | Ding | | H04L 25/03885 |
| | | | | 375/345 |
| 9,184,957 B2 * | 11/2015 | Chang | | H04B 1/16 |
| 9,397,872 B2 * | 7/2016 | Kamali | | H04L 25/03057 |
| 9,595,975 B1 * | 3/2017 | Song | | H03M 1/12 |
| 9,614,564 B2 * | 4/2017 | Chang | | H04L 25/02 |
| 9,614,697 B2 * | 4/2017 | Chang | | H04L 25/02 |
| 9,654,327 B2 * | 5/2017 | Liao | | H04L 25/03057 |
| 9,674,008 B2 * | 6/2017 | Hekmat | | H03M 1/002 |
| 9,876,656 B1 * | 1/2018 | Freitas | | H04L 25/03133 |
| 9,912,309 B1 * | 3/2018 | Ecker | | H03F 3/45977 |
| 10,116,470 B2 * | 10/2018 | Gu | | H03F 3/45179 |
| 10,263,815 B1 * | 4/2019 | Geary | | H04L 25/03885 |
| 10,536,178 B2 * | 1/2020 | Chang | | H04L 7/0087 |
| 10,574,353 B2 * | 2/2020 | Zheng | | H04B 10/66 |
| 10,785,070 B1 * | 9/2020 | Takada | | H04L 7/0337 |
| 10,848,350 B1 * | 11/2020 | Hossain | | H04L 25/085 |
| 10,897,279 B1 * | 1/2021 | Liu | | H03F 3/45977 |
| 10,992,277 B1 * | 4/2021 | Sun | | H03G 3/3036 |
| 11,204,888 B2 * | 12/2021 | Khashaba | | H04L 7/0087 |
| 11,218,225 B1 * | 1/2022 | Alnabulsi | | H04L 25/03038 |
| 11,303,480 B2 * | 4/2022 | Siddamurthy | | H03F 3/45744 |
| 11,323,100 B1 * | 5/2022 | Jang | | H03K 3/02335 |
| 11,552,830 B2 * | 1/2023 | ElShater | | H04L 25/03878 |
| 2004/0227554 A1 * | 11/2004 | Park | | H03F 3/45183 |
| | | | | 327/280 |
| 2005/0134307 A1 * | 6/2005 | Stojanovic | | H04L 25/028 |
| | | | | 326/31 |
| 2007/0013440 A1 * | 1/2007 | Chen | | H03F 3/45973 |
| | | | | 330/9 |
| 2008/0088350 A1 * | 4/2008 | Sohn | | H03K 5/1565 |
| | | | | 327/175 |
| 2009/0232195 A1 * | 9/2009 | Ozawa | | H04L 7/033 |
| | | | | 375/232 |
| 2009/0273395 A1 * | 11/2009 | Huang | | H03F 3/45183 |
| | | | | 330/9 |
| 2010/0164589 A1 * | 7/2010 | Lee | | H03F 3/45475 |
| | | | | 327/307 |
| 2011/0128045 A1 * | 6/2011 | Nakamoto | | H04L 25/06 |
| | | | | 327/50 |
| 2011/0228864 A1 * | 9/2011 | Aryanfar | | H04L 25/0272 |
| | | | | 375/259 |
| 2012/0139638 A1 * | 6/2012 | Kaviani | | H03G 1/007 |
| | | | | 330/289 |
| 2014/0064351 A1 * | 3/2014 | Hidaka | | H04L 27/01 |
| | | | | 375/232 |
| 2014/0185661 A1 * | 7/2014 | Chang | | H04B 1/16 |
| | | | | 375/232 |
| 2015/0116299 A1 * | 4/2015 | Hekmat | | H04L 25/03057 |
| | | | | 345/212 |
| 2016/0028560 A1 * | 1/2016 | Chang | | H04B 1/16 |
| | | | | 375/232 |
| 2016/0308566 A1 * | 10/2016 | Chang | | H04L 25/03019 |
| 2017/0093416 A1 * | 3/2017 | Song | | H03K 19/0944 |
| 2017/0207805 A1 * | 7/2017 | Chang | | H04L 25/02 |
| 2018/0337806 A1 * | 11/2018 | Farjad-Rad | | H04L 25/03019 |
| 2018/0367103 A1 * | 12/2018 | Kudo | | H03K 5/24 |
| 2019/0356325 A1 * | 11/2019 | Hu | | H03F 3/45766 |
| 2020/0052933 A1 * | 2/2020 | Lee | | H04L 25/03057 |
| 2021/0175868 A1 * | 6/2021 | Li | | H04L 25/0292 |
| 2021/0248103 A1 * | 8/2021 | Khashaba | | H04L 7/0087 |
| 2022/0085779 A1 | 3/2022 | Yamamoto | | |
| 2022/0103400 A1 * | 3/2022 | ElShater | | H04L 25/062 |
| 2022/0302943 A1 * | 9/2022 | Bandi | | H04L 25/03318 |
| 2023/0170887 A1 * | 6/2023 | Kim | | H03K 5/05 |
| | | | | 327/291 |
| 2023/0171132 A1 * | 6/2023 | Kim | | H03K 21/08 |
| | | | | 375/340 |
| 2023/0246885 A1 * | 8/2023 | Li | | H03G 1/0029 |
| | | | | 375/232 |
| 2023/0268896 A1 * | 8/2023 | Fazli Yeknami | | |
| | | | | H04L 25/03885 |
| | | | | 330/250 |

OTHER PUBLICATIONS

EPO Extended European Search Report dated Sep. 1, 2023, issued in corresponding European Patent Application No. 23165457.5 (10 pages).

* cited by examiner

REAL-TIME DC-BALANCE AWARE AFE OFFSET CANCELLATION

CROSS-REFERENCE TO RELATED APPLICATION(S)

This application is based on and claims priority under 35 U.S.C. § 119 to U.S. Provisional Application No. 63/333,818, filed on Apr. 22, 2022, the disclosure of which is incorporated herein by reference in its entirety.

BACKGROUND

1. Field

The disclosure relates to high-speed serial data links, and more particularly to offset cancellation in an analog front end of a high-speed serial receiver.

2. Description of Related Art

A channel used in a high-speed serial data link nay have characteristics, such as frequency-dependent loss, or phase dispersion, that may result errors in the received data if measures are not taken to compensate. A receiver of the serial data link may include an analog front end (AFE), which t may include components such as a continuous-time linear equalizer (DTI) for compensating for a loss in channel of the serial data, and to equalize a response of the channel.

However, variations in the manufacturing process, for example layout mismatch or asymmetry, or other mismatches between components such as transistors, resistors, capacitors, and so on, may cause a direct current (DC) offset in one or more of AFE components such as the CTLE, and problems may arise if the DC offset is not canceled.

SUMMARY

Provided are a receiver for a serial data link, which may include an AFE or a CTLE which may be configured to perform a DC offset calibration, a calibration circuit included therein, and a method of performing the DC offset calibration.

In accordance with some embodiments, a receiver for a serial data link may include: an analog front end (AFE) including a continuous-time linear equalizer (CTLE) configured to receive an input signal from a transmitter, the CTLE including a first output node; a second output node; a plurality of programmable tail current sources configured to adjust a direct current (DC) offset between the first output node and the second output node; and a calibration circuit. The calibration circuit may include: a slicer configured to output a difference between a first average output voltage corresponding to the first output node and a second average output voltage corresponding to the second output node; and a calibration counter configured to increment or decrement an offset count based on the difference, wherein the plurality of programmable tail current sources are adjusted based on a value of the offset count.

In accordance with some embodiments, the value of the offset count may indicate an amount of the DC offset between the first output node and the second output node.

In accordance with some embodiments, based on the value of the offset count, an amount of current passing through the plurality of programmable tail current sources is adjusted such that, the amount of the DC offset is reduced.

In accordance with some embodiments, the receiver may further include a bit counter configured to count a number of ones (1s) and a number of zeroes (0s) included in a deserialized signal corresponding to the input signal, and the plurality of programmable tail current sources may be adjusted based on the number of the ones (1s) being equal to the number of the zeroes (0s).

In accordance with some embodiments, the receiver may further include a latch circuit configured to latch the value of the offset count based on a latch enable signal provided by the bit counter, and to provide the latched value of the offset count to the plurality of programmable tail current sources, the plurality of programmable tail current sources may be adjusted based on the latched value of the offset count, and the bit counter may be further configured to pulse the latch enable signal based on the number of ones (1s) being equal to the number of zeroes (0s).

In accordance with some embodiments, the bit counter may be further configured to wait at least a predetermined amount of time between subsequent pulses.

In accordance with some embodiments, the slicer may include a one-bit analog-to-digital converter.

In accordance with some embodiments, the first average output voltage and the second average output voltage may be filtered before being provided to the one-bit analog-to-digital converter.

In accordance with some embodiments, a calibration circuit for calibrating a CTLE included in an AFE for a receiver of a serial data link may include: a slicer configured to output a difference between a first average output voltage corresponding to a first output node of the CTLE and a second average output voltage corresponding to a second output node of the CUE; and a calibration counter configured to increment or decrement an offset count based on the difference, wherein a plurality of programmable tail current sources of the CTLE are adjusted based on a value of the offset count.

In accordance with some embodiments, the value of the offset count may indicate an amount of a DC offset between the first output node and the second output node.

In accordance with some embodiments, an amount of a current passing through the plurality of programmable tail current sources may be adjusted such that an amount of the DC offset is reduced.

In accordance with some embodiments, the calibration circuit may further include a latch circuit configured to receive a latch enable signal from a bit counter, latch the value of the offset count based on the latch enable signal, and provide the latched value of the offset count to the CTLE. Again, the plurality of programmable tail current sources of the CTLE may be adjusted based on the latched value of the offset count.

In accordance with some embodiments, the latch enable signal may be received from the bit counter based on a number of ones (1s) and a number of zeroes (0s) included in a deserialized signal corresponding to an input signal received by the CTLE.

In accordance with some embodiments, the latch enable signal may be received from the bit counter based on the number of the ones (1s) being equal to the number of the zeroes (0s).

In accordance with some embodiments, the slicer may include a one-bit analog-to-digital converter.

In accordance with some embodiments, the calibration circuit may further include a filter configured to filter the first average output voltage and the second average output voltage, and provide the filtered first average output voltage and the filtered second average output voltage to the one-bit analog-to-digital converter.

In accordance with some embodiments, a method of adjusting a DC offset in a CTLE included in an FE for a receiver of a serial data link may include: receiving an input signal from a transmitter; determining a difference between a first average output voltage corresponding to a first output node of the CTLE and a second average output voltage corresponding to a second output node of the CTLE; and incrementing or decrementing an offset count based on the difference; and adjusting a plurality of programmable tail current sources included in the CTLE based on a value of the offset count.

In accordance with some embodiments, the value of the offset count may indicate an amount of a DC offset between the first output node and the second output node.

In accordance with some embodiments, the adjusting of the plurality of programmable tail current sources comprises adjusting an amount of current passing through the plurality of programmable tail current sources based on the value of the offset count such that the amount of the DC offset is reduced.

In accordance with some embodiments, the method may further include counting a number of ones (1s) and a number of zeroes (0s) included in a deserialized signal corresponding to the input signal, and the plurality of programmable tail current sources may be adjusted based on the number of the ones (1s) being equal to the number of the zeroes (0s).

In accordance with some embodiments, the method may further include latching the value of the offset count based on the number of the ones (1s) being equal to the number of the zeroes (0s), and the plurality of programmable tail current sources may be adjusted based on the latched value of the offset count.

In accordance with some embodiments, the method may further include filtering the first average output voltage and the second average output voltage before determining the difference.

BRIEF DESCRIPTION OF THE DRAWINGS

These and/or other aspects will become apparent and more readily appreciated from the following description, taken in conjunction with the accompanying drawings in which.

DETAILED DESCRIPTION

Hereinafter, exemplary embodiments of the disclosure will be described in detail with reference to the accompanying drawings in which like reference numerals refer to like elements throughout. It is understood, however, that the disclosure is not limited to embodiments described herein, and that features and components from one embodiment may be included or omitted in another embodiment. For convenience, duplicative description of elements that are the same or similar may be omitted.

Further, it is understood that as used herein, expressions such as "at least one of," when preceding a list of elements, modify the entire list of elements and do not modify the individual elements of the list. For example, the expressions "at least one of [A], [B], and [C]" or "at least one of [A], [B], or [C]" means only A, only B, only C, A and B, B and C, A and C, or A, B, and C.

It is also understood that, although the terms "first," "second," etc., may be used herein to describe various elements, these elements should not be limited by these terms (e.g., should not be interpreted as designating a relative order or significance). These terms are only used to distinguish one element from another.

Additionally, as used herein, the singular forms "a," "an" and "the" are intended to include the plural forms as well, unless otherwise indicated explicitly or by the surrounding context.

The following description is presented to enable one of ordinary skill in the art to make and use the invention and to incorporate it in the context of particular applications. While the foregoing is directed to specific examples, other and further examples may be devised without departing from the basic scope thereof.

Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the description provided, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Various features are described hereinafter with reference to the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6 or 35 U.S.C. 112(f).

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Data processing may include data buffering, aligning incoming data from multiple communication lanes, forward error correction ("FEC"), and/or others. For example, data may be first received by an analog front end (AFE), which prepares the incoming data for digital processing. The digital portion (e.g., DSPs) of a transceiver can provide skew management, equalization, reflection cancellation, and/or other functions. It is to be appreciated that the process described herein can provide many benefits, including saving both power and cost.

Moreover, the terms "system," "component," "module," "interface," "model," or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Unless explicitly stated otherwise, each numerical value and range can be interpreted as being approximate as if the word "about" or "approximately" preceded the value of the value or range. Signals and corresponding nodes or ports might be referred to by the same name and are interchangeable for purposes here.

While embodiments have been described with respect to circuit functions, the embodiments of the present invention are not limited. Possible implementations, may be embodied in a single integrated circuit, a multi-chip module, a single card, system-on-a-chip, or a multi-card circuit pack. As would be apparent to one skilled in the art, the various embodiments might also be implemented as part of a larger system. Such embodiments might be employed in conjunction with, for example, a digital signal processor, microcontroller, field-programmable gate array, application-specific integrated circuit, or general-purpose computer.

As would be apparent to one skilled in the art, various functions of circuit elements might also be implemented as processing blocks in a software program. Such software might be employed in, for example, a digital signal processor, microcontroller, or general-purpose computer. Such software might be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. Described embodiments might also be manifest in the form of a bit stream or other sequence of signal values electrically or optically transmitted through a medium, stored magnetic-field variations in a magnetic recording medium, etc. generated using a method and/or an apparatus as described herein.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

Figure 1:
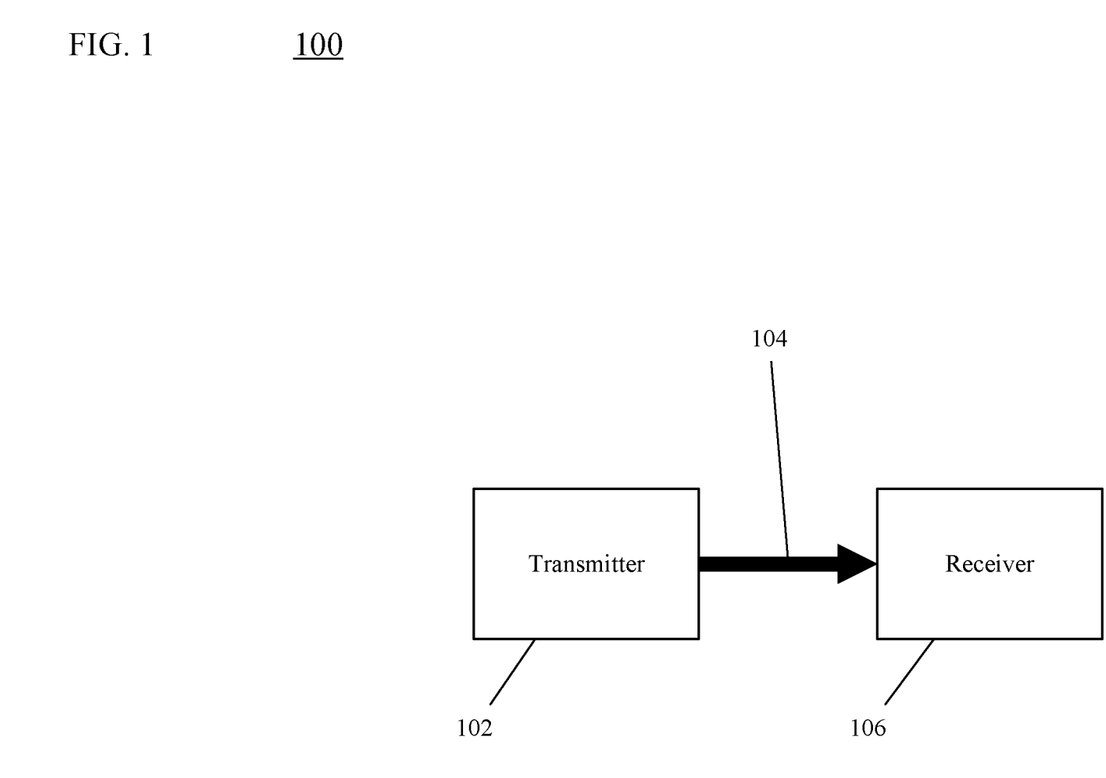
FIG. 1 is a block diagram of a serial data link, in accordance with some embodiments.

FIG. 1 is a block diagram of a serial data link 100, according to an embodiment. As can be seen in FIG. 1, the serial data link 100 may include a transmitter 102, a channel 104, and a receiver 106. The transmitter 102 may drive the channel 104 with an output, that switches between two states, one state representing binary 0 and one representing binary 1. The channel 104 may be a conductor or a plurality of conductors. The channel 104 may include, for example, a single conductor (e.g., over a ground plane) or the channel 104 may include two conductors (e.g., a driven conductor and a separate ground conductor), or the channel 104 may include two driven conductors (e.g., two conductors driven with a differential signal), or three conductors including two driven conductors (e.g., two conductors driven with a differential signal) and a ground conductor. In embodiments, the serial data link may provide a high-speed serial data stream, for example a serial data stream operating on the order of 10 gigabits per second (Gbps), however embodiments are not limited thereto.

Figure 2:
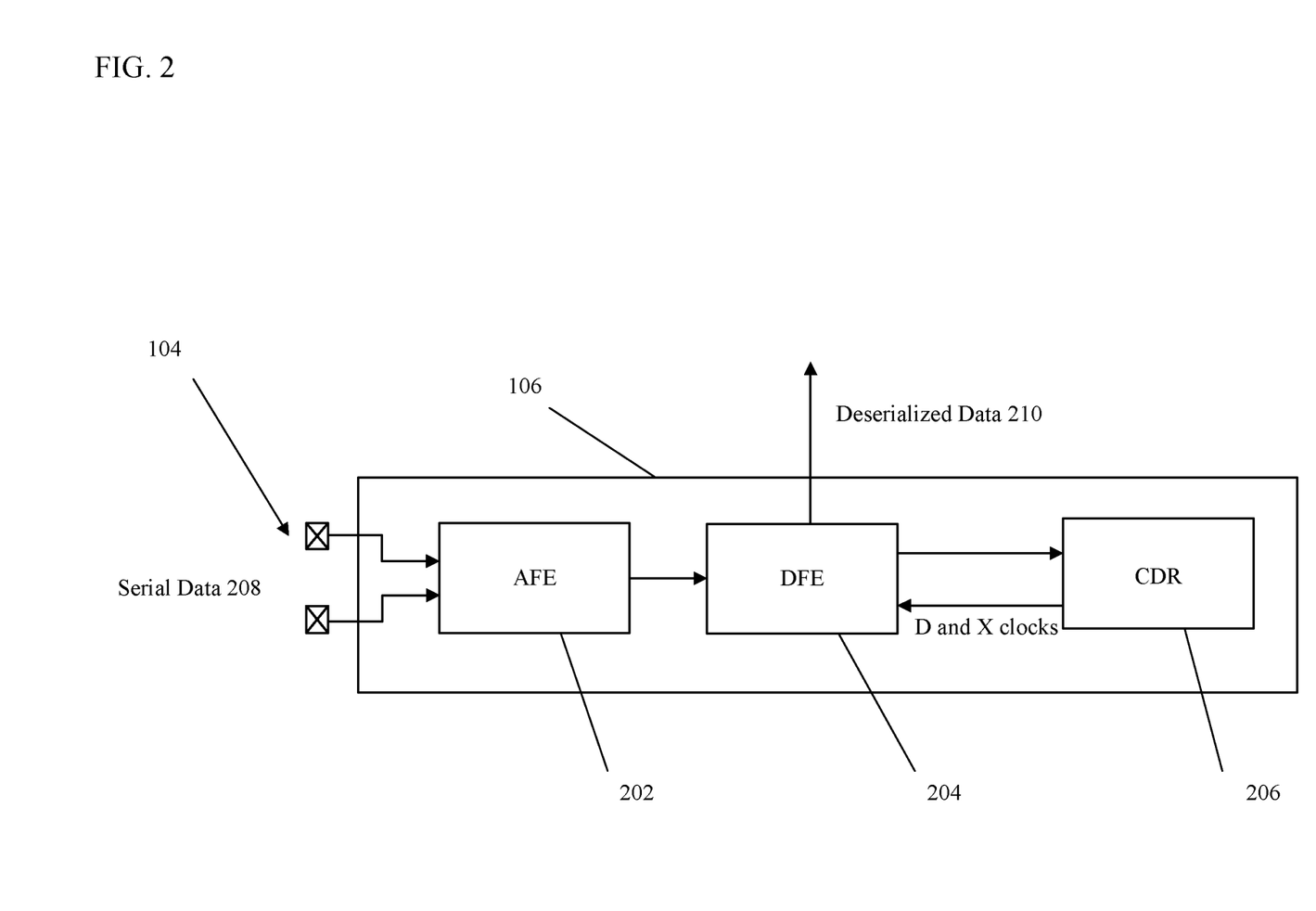
FIG. 2 is a block diagram of a receiver of a serial data link, in accordance with some embodiments.

FIG. 2 is a block diagram of a receiver 106, according to an embodiment. As can be seen in FIG. 2, the receiver 106 may include an analog front end (AFE) 202, a decision-feedback equalizer (DFE) 204, and a clock and data recovery circuit (CDR) 206. In some embodiments, the AFE 202 may receive a serial data stream (illustrated for example as serial data 208) through the channel 104, and the AFE 202, the DFE 204, and the CDR 206 may operate together to provide a deserialized signal (illustrated for example as deserialized data 210) corresponding to the serial data stream.

As discussed above, the channel 104 may have characteristics, such as frequency-dependent loss or phase dispersion, that may result in inter-symbol interference (ISI), and errors in received data if measures are not taken to compensate. For example, the AFE 202 may include a continuous-time linear equalizer (CTLE) for compensating for a signal loss occurring in the channel 104, and equalizing a response of the channel.

Figure 3:
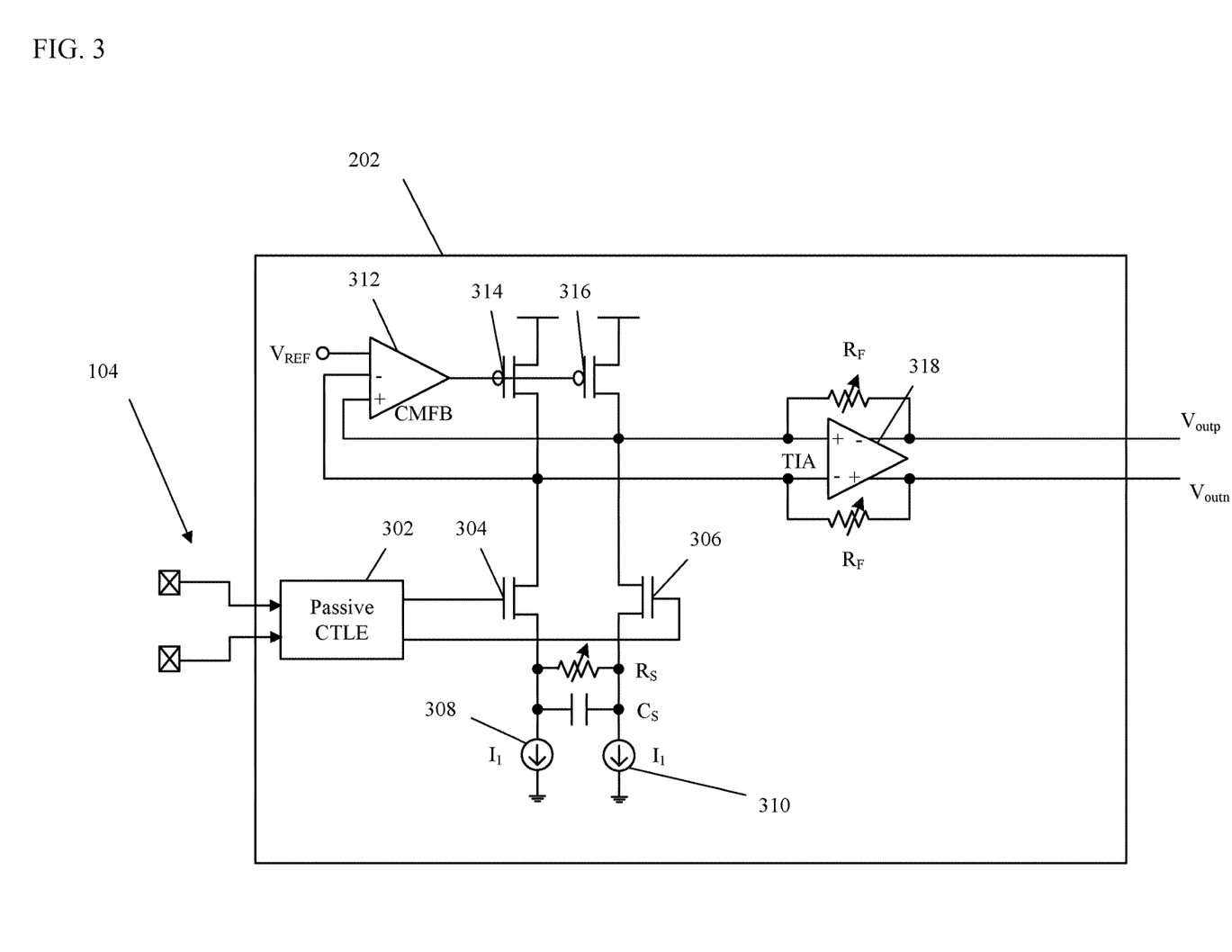
FIG. 3 is a block diagram of an analog front end of a receiver of a serial data link, in accordance with some embodiments.

FIG. 3 is a block diagram of the AFE 202 shown in FIG. 2, according to an embodiment. In embodiments, the components illustrated in FIG. 3 as being included in the AFE 202 may be referred to as, or may perform one or more of functions of, a CTLE. In embodiments, one or more of the AFE 202 and a CTLE included in the AFE 202 may equalize the channel loss discussed above by removing a long tail from a pulse response of the receiver 106.

As can be seen in FIG. 3, the AFE 202 may include an input block including a passive CTLE module 302, input transistors 304 and 306, a resistor $R_s$, a capacitor $C_s$, and tail current sources 308 and 310. The AFE 202 may further include a common-mode feedback (CMFB) loop including CMFB amplifier 312 and CMFB transistors 314 and 316. In addition the AFE 202 may include a transimpedance amplifier (TIA) block which may include a TIA 318 and resistors $R_F$. In embodiments, the serial data stream may be received from the channel 104 in the form of an input voltage, which may be for example a differential input voltage. An input block of the AFE 202 may perform a voltage-to-current conversion on the input voltage to generate an input current, and the TIA block may perform a current-to-voltage conversion on the input current to generate an output voltage, which may be the differential output voltage. In embodiments, the differential output voltage may be expressed as a positive output voltage $V_{outp}$ at a first output node of the AFE 202, and a negative output voltage $V_{outn}$ at a second output node of the AFE 202. In embodiments, the CMFB loop may detect a common-mode voltage included in the AFE 202 and raise or lower the common-mode voltage to a predetermined reference voltage $V_{REF}$.

As discussed above, the AFE 202 may have a DC offset, and problems may arise if the DC offset is not canceled. In embodiments, the DC offset may be caused by, for example, layout mismatch or asymmetry in the AFE 202, and/or by local mismatch between components such as transistors, resistors, capacitors, and so on included in the AFE 202.

Figure 4:
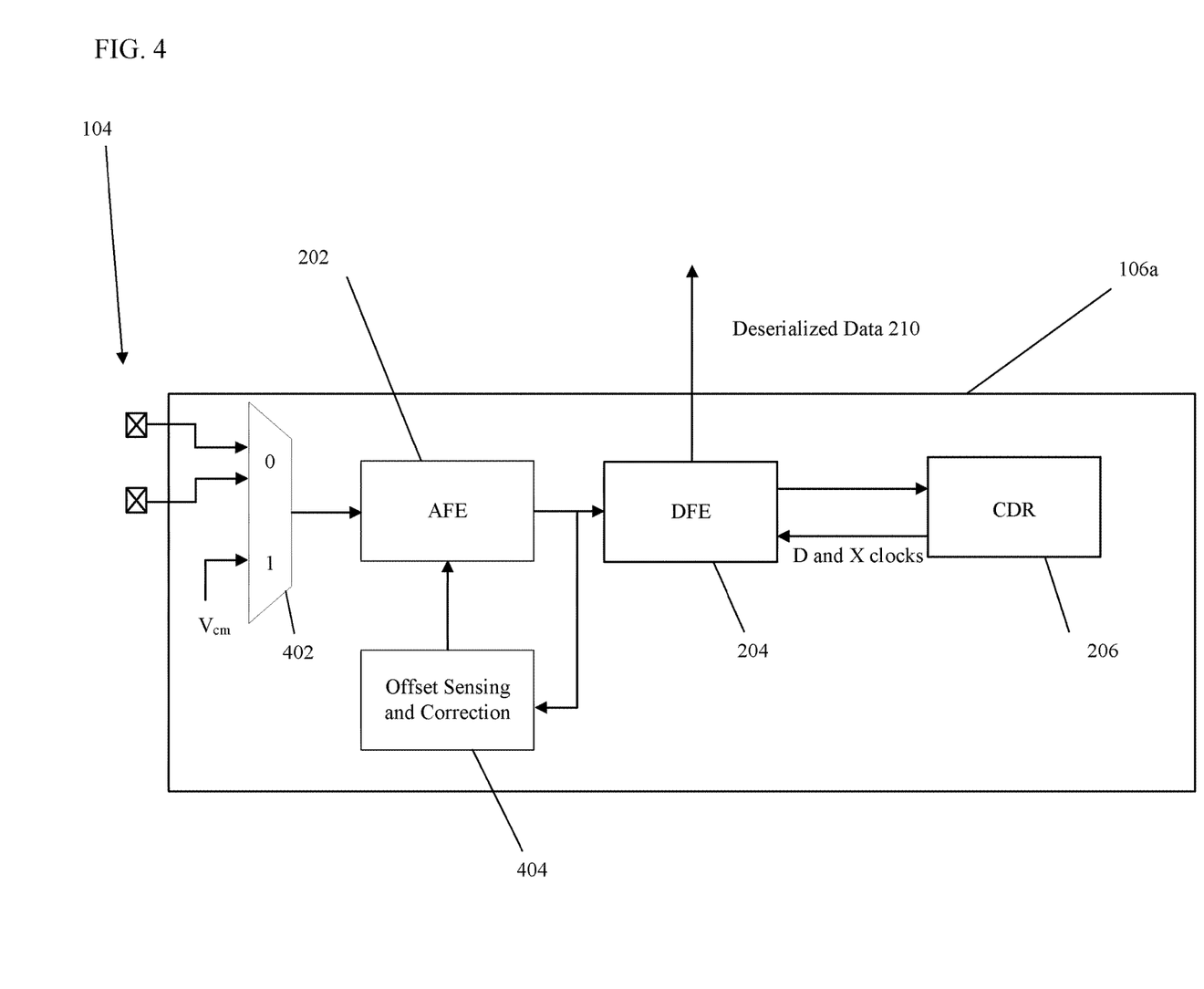
FIG. 4 is a block diagram of a receiver of a serial data link, in accordance with some embodiments.

FIG. 4 is a block diagram of a receiver 106a, according to an embodiment. In particular, the receiver 106a may be configured to perform an offset cancellation technique. As can be seen in FIG. 4, the receiver 106a may be similar to the receiver 106, and may include a multiplexer 402 and an offset sensing and correction module 404. In some embodiments, when the receiver 106a is operated in a normal mode, which may be referred to as a mission mode, the serial data stream may be provided from the channel 104 to the AFE 202 by the multiplexer 402. According to the offset cancellation technique, the receiver 106a may also enter a special calibration mode in which the multiplexer 402 may provide a common-mode voltage $V_{cm}$ to the AFE 202 instead of the serial data stream received from the channel 104.

When the common-mode voltage $V_{cm}$ is provided as input for the AFE 202, if an amount of the DC offset is zero, then an output of the AFE 202 should also be zero. Therefore, if the output of the AFE 202 is non-zero while the common-mode voltage $V_{cm}$ is provided, this may indicate that a DC offset is present and should be corrected. While the receiver 106a is operated in a special calibration mode, the offset sensing and correction module 404 may detect a non-zero output, for example a non-zero output voltage $V_{outp}$ and $V_{outn}$, from the AFE 202 and adjust the AFE 202 to reduce or eliminate the DC offset.

However, the offset cancellation technique described above with respect to FIG. 4 may cause potential issues. For example, because this offset cancellation technique cannot be performed while the AFE 202 receives the serial data stream, the receiver 106a must be placed in the special calibration mode in order to perform the offset cancellation technique. Therefore, either the receiver 106a must suffer repeated interruptions to the serial data stream, or the offset cancellation technique may only be performed infrequently. In addition, insertion of any components such as the multiplexer 402 into a high-speed signal path of the receiver 106a may reduce an overall bandwidth of the high-speed signal path.

Therefore, additional embodiments of the present disclosure may relate to a DC offset cancellation technique which may run constantly, even while the AFE 202 receives the serial data stream, and does not require the receiver 106 or 106a to enter the special calibration mode. Accordingly, additional embodiments of the present disclosure may allow the AFE 202 to reduce loading of the high-speed signal path, for example, by removing the need for a multiplexer in the high-speed signal path. In addition, because the special calibration mode is not required, the DC offset cancellation technique may be performed over a long time span. As a result, embodiments of the present disclosure may allow the AFE 202 to cancel or correct slow time-varying offsets, for example offsets caused by temperature shifts. For example, in embodiments in which the serial data stream operates at 10 Gbps, a temperature change large enough to affect a DC offset of the AFE 202 may develop on the order of, for example, milliseconds or microseconds.

Figure 5:
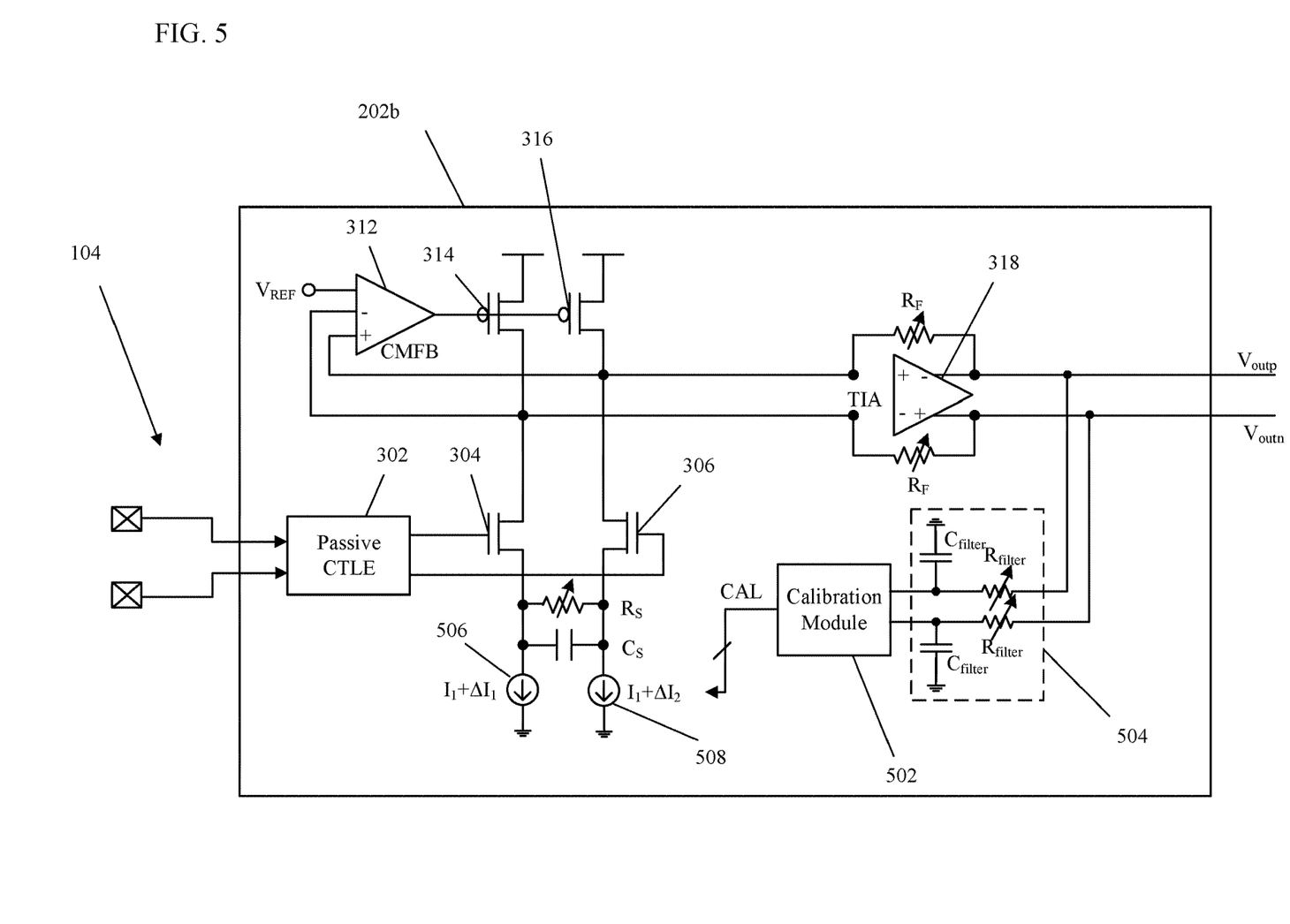
FIG. 5 is a block diagram of an analog front end of a receiver of a serial data link, in accordance with some embodiments.

FIG. 5 is a block diagram of an AFE 202b, according to an embodiment. In particular, the AFE 202b may be configured to perform an offset cancellation technique according to embodiments of the present disclosure. In embodiments, if a random serial data stream is received as input and an amount of the DC offset at the output of the AFE 202b is zero, then an average of the positive output voltage $V_{outp}$ may be equal to an average of the negative output voltage $V_{outn}$, if the averages are calculated over a long enough time.

As can be seen in FIG. 5, the AFE 202b may be similar to AFE 202, and may further include a filter 504 and a calibration module 502. In embodiments, the filter 504 may include a resistors $R_{filter}$ and a capacitors $C_{filter}$, however embodiments are not limited thereto. In embodiments, the AFE 202b may include tail current sources 506 and 508, which may be programmable or adjustable tail current sources.

In some embodiments, the filter 504 may receive and filter output voltages $V_{outp}$ and $V_{outn}$, and may provide filtered output voltages $V_{outp}$ and $V_{outn}$ to the calibration module 502. In embodiments, the filtered output voltages $V_{outp}$ and $V_{outn}$ may represent long-term averages of the output voltages $V_{outp}$ and $V_{outn}$. For example, in embodiments in which the serial data stream operates at 10 Gbps, the filtered output voltages $V_{outp}$ and $V_{outn}$ may represent averages of the output voltages $V_{outp}$ and $V_{outn}$ over one or more microseconds. Based on the filtered output voltages $V_{outp}$ and $V_{outn}$ the calibration module 502 may provide a calibration signal CAL, which may indicate the amount of the DC offset. In some embodiments, the calibration signal CAL may include N bits, where N is a number greater than or equal to one (1), and the N bits may indicate the amount of the DC offset. In some embodiments, the tail current sources 506 and 508 may be adjusted based on the calibration signal CAL in order to cancel or reduce the DC offset. For example, the tail current sources 506 and 508 may be adjusted by adding one or more of $\Delta I_1$ and $\Delta I_2$ to a current $I_1$ passing through one or more of the tail current sources 506 and 508 in order to cancel or reduce the DC offset.

Figure 6:
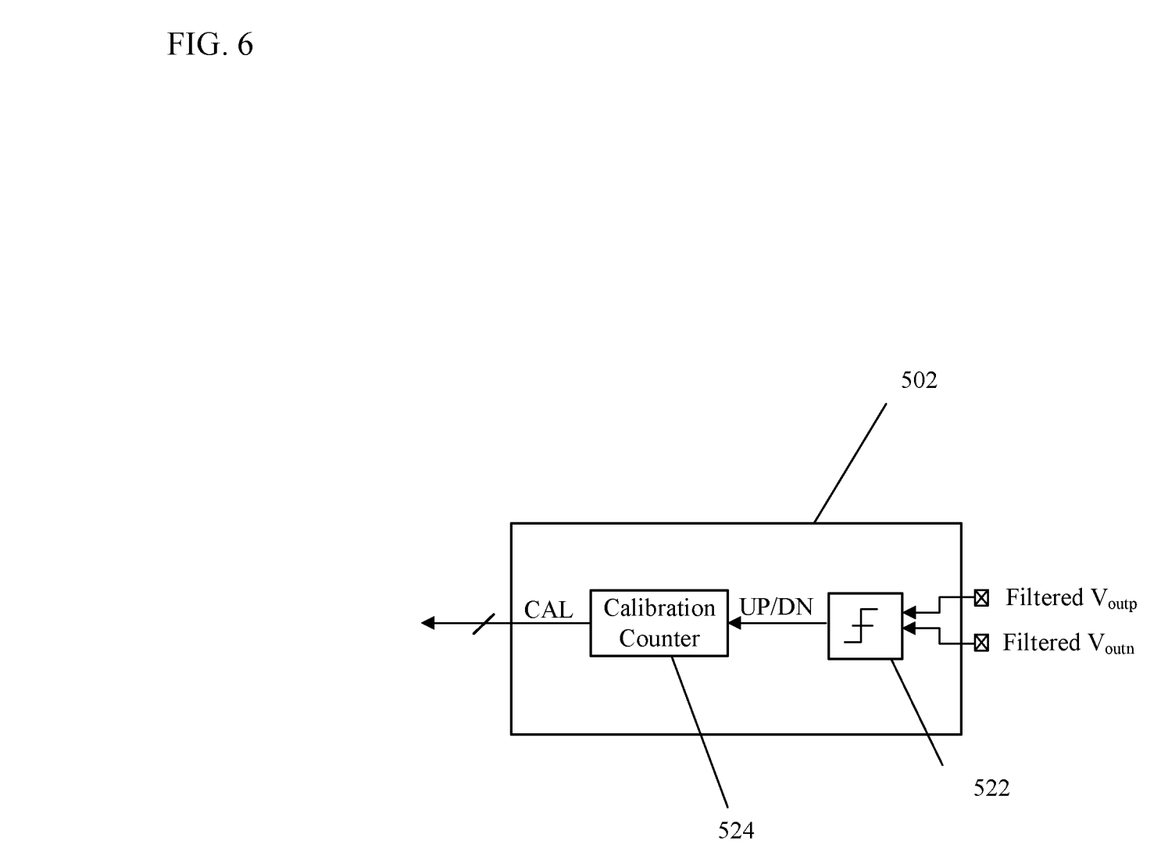
FIG. 6 is a block diagram of a calibration module, in accordance with some embodiments.

FIG. 6 is a block diagram of the calibration module 502, in accordance with some embodiments of the present disclosure. As can be seen in FIG. 6, the calibration module 502 may include a slicer 522 and a calibration counter 524. In some embodiments, the slicer 522 may receive the filtered output voltages $V_{outp}$ and $V_{outn}$, and the slicer 522 may output a slicer signal UP/DN. The slicer signal UP/DN may indicate whether a difference between the filtered output voltages $V_{outp}$ and $V_{outn}$ greater than zero or less than zero. In some embodiments, if the difference between the filtered output voltages $V_{outp}$ and $V_{outn}$ is exactly zero, the slicer signal UP/DN may be a random output. For example, if a differential voltage between the filtered output voltages $V_{outp}$ and $V_{outn}$ is greater than zero, the slicer 522 may output a slicer signal UP/CN having a value of 1, and based on a differential voltage between the filtered output voltages $V_{outp}$ and $V_{outn}$ being less than zero, the slicer 522 may output a slicer signal UP/DN having a value of 0. In embodiments, the slicer 522 may periodically sample the filtered output voltages $V_{outp}$ and $V_{outn}$ and/or periodically provide the slicer signal UP/DN. In embodiments, the slicer 522 may include al-bit analog-to-digital converter which may be used to provide the slicer signal UP/DN based on the filtered output voltages $V_{outp}$ and $V_{outn}$.

Based on the slicer signal UP/DN, the calibration counter 524 may increment or decrement a value of an offset count, and may output the value of the offset count using the calibration signal CAL. For example, the value of the offset count may be indicated by the N bits included in the calibration signal CAL. In some embodiments, given a random serial data stream over a long enough time, if the amount of the DC offset of AFE 202a is zero, then the value of the offset count should also be zero. Therefore, if the value of the offset count is non-zero, this may indicate that a DC offset is present and should be corrected. In addition, the value of the offset count may indicate an amount of the DC offset, and the tail current sources 506 and 508 may therefore be adjusted based on the value of the offset count.

However, in some embodiments the serial data stream received by AFE 202b may be non-random, and for example may include data which is not DC balanced due to an unequal number of ones (1s) or zeroes (0s) included in data of the serial data stream. As a result, the calibration signal CAL that is output by the calibration module 502 may be influenced by a DC balance of the serial data stream in addition to any potential DC offset present in the AFE 202b, and therefore may not accurately indicate the amount of the DC offset. For example, the value of the offset count may not accurately indicate the amount of the DC offset, but instead may indicate the amount of the DC offset and also an additional offset corresponding to the DC unbalanced data. As a result, if the tail current sources 506 and 508 are adjusted based on the calibration signal CAL, the DC offset may be overcorrected or undercorrected. Therefore, it may be desirable to track a DC balance of the serial data stream in order to provide more accurate calibration signal CAL.

Figure 7:
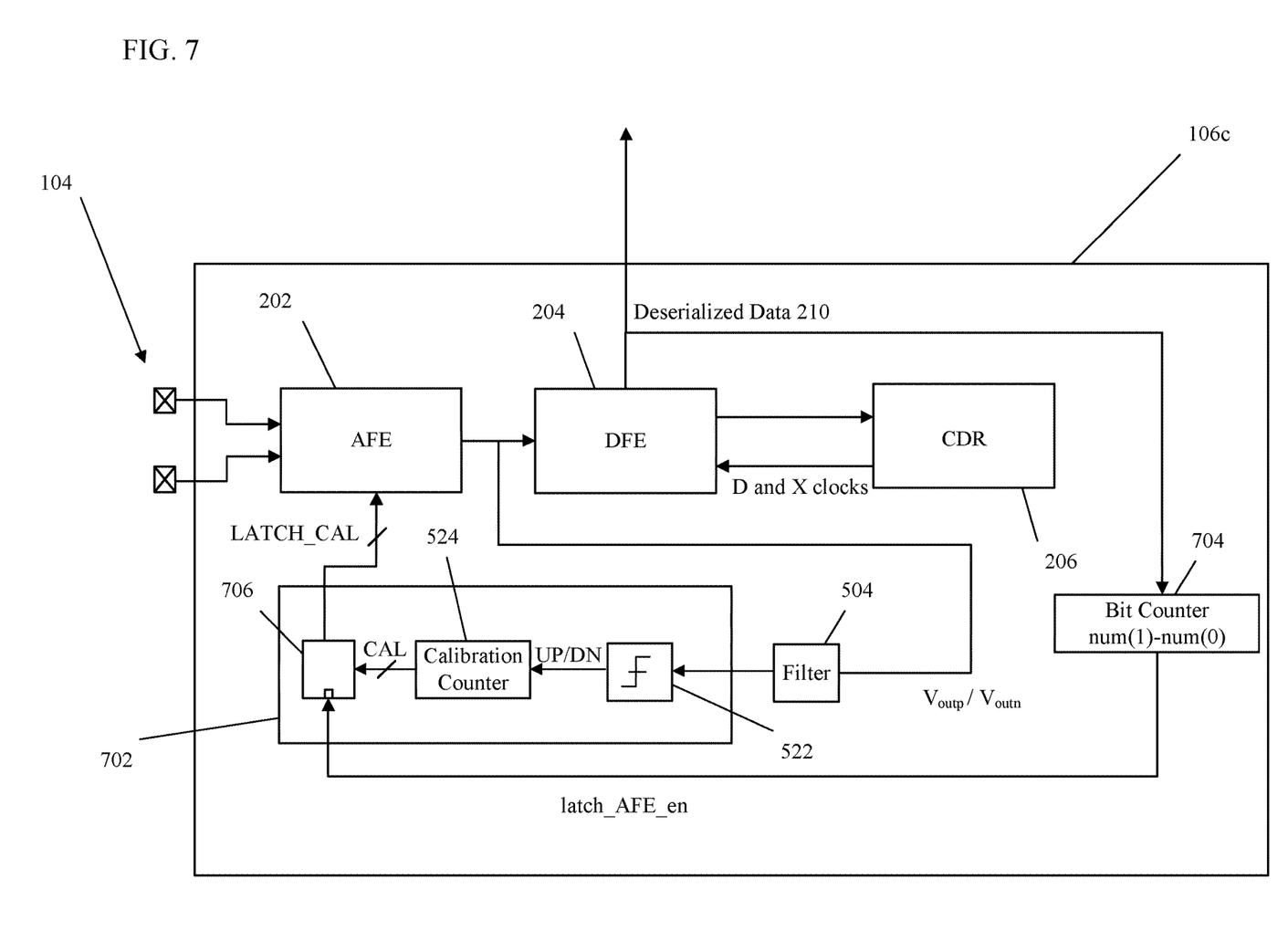
FIG. 7 is a block diagram of a receiver of a serial data link, in accordance with some embodiments.

FIG. 7 is a block diagram of a receiver 106c, according to an embodiment. In particular, the receiver 106c may be configured to perform an offset cancellation technique according to embodiments of the present disclosure. In one embodiment, if the amount of the DC offset at the output of the AFE 202 is zero, then an average of the positive output voltage $V_{outp}$ may be equal to an average of the negative output voltage $V_{outn}$ if the number of ones (1s) included in the data of the serial data stream, which may be referred to as num(1), is equal to the number of zeroes (0s) included in the data of the serial data stream, which may be referred to as num(0). Therefore, the value of the offset count determined by the calibration counter 502 may only accurately indicate the amount of the DC offset when num(1)−num(0) =0. In other words, the value of the offset count may only accurately indicate the amount of the DC offset at certain specific times at which the serial data stream is DC balanced.

As can be seen in FIG. 7, the receiver 106c may be similar to the receiver 106, and may further include the filter 504, a calibration module 702, and a bit counter 704. In addition, the calibration module 702 may be similar to the calibration module 502, and may further include a latch 706.

In some embodiments, the bit counter 704 may receive a deserialized signal corresponding to the serial data stream from DFE 204, and may track num(1) and num(0). In embodiments, the bit counter 704 may provide a latch signal latch_AFE_en based on the values of num(1) and num(0). For example, the bit counter 704 may provide the latch signal latch_AFE_en based on the value of num(1)−num(0).

Figure 8:
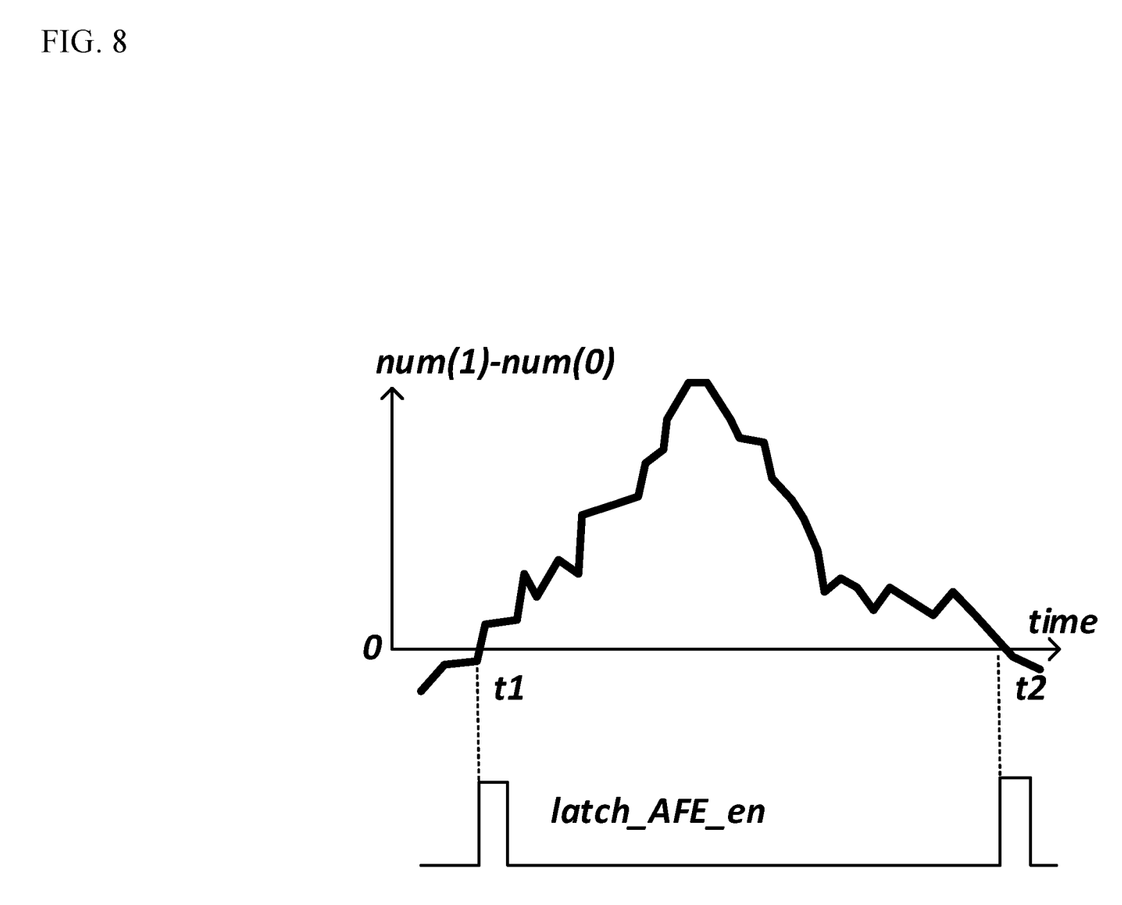
FIG. 8 is a graph showing an example of an output of a bit counter, in accordance with some embodiments.

FIG. 8 is a graph showing an example of an output of the bit counter 602, according to an embodiment. As can be seen in FIG. 8, in embodiments, the bit counter 704 may pulse the latch signal latch_AFE_en for a predetermined period of time based on the value of num(1)−num(0) reaching or crossing zero. For example, the latch signal latch_AFE_en may be pulsed at time t1 based on the value of num(1)−num(0) crossing zero in a positive direction, and the latch signal latch_AFE_en may be pulsed at time t2 based on the value of num(1)−num(0) crossing zero in a negative direction. However, embodiments are not limited thereto. For example, the bit counter 704 may pulse or otherwise provide the latch signal latch_AFE_en based on the value of num (1)−num(0) being close to zero, for example within a certain threshold value of zero.

Referring again to FIG. 7, the calibration counter 524 may provide the calibration signal CAL to the latch 706. The latch 706 may latch the calibration signal CAL based on the latch signal latch_AFE_en. For example, the latch 706 may latch the calibration signal CAL based on the latch signal latch_AFE_end being pulsed by the bit counter 704. The latch 706 may provide the latched calibration signal LATCH_CAL to the AFE 202 for offset correction. In embodiments, the calibration signal CAL provided from the calibration counter 524 to the latch 706 may be referred to as an internal calibration signal, and the latched calibration signal LATCH_CAL provided from the latch 706 to the AFE 202 may be referred to as an external calibration signal.

In embodiments, at times at which the number of ones (1s) included in the serial data stream is equal to the number of zeroes (0s) included in the serial data stream, the serial data stream may be DC balanced, and the value of the offset count may accurately indicate the amount of the DC offset. Because this results in the value of num(1)−num(0) being zero, the bit counter may pulse or otherwise provide the latch signal latch_AFE_en to the latch 706, and therefore the internal calibration signal may be provided to the AFE 202 as the external calibration signal. As a result, an accurate value of the offset count may be provided to the AFE 202, and may be used for offset correction.

Further, at times at which the number of ones (1s) included in the serial data stream is not equal to the number of zeroes (0s) included in the serial data stream, the serial data stream may be DC unbalanced, and the value of the offset count may not accurately indicate the amount of the DC offset. However, because this results in the value of num(1)−num(0) being non-zero, the bit counter may not pulse or otherwise provide the latch signal latch_AFE_en to the latch 706, and therefore the internal calibration signal may be not provided to the AFE 202 as the external calibration signal. As a result, an inaccurate value of the offset count may be not provided to the AFE 202, and therefore may be not used for offset correction.

In some embodiments, the bit counter 704 may ensure that, after the latch signal latch_AFE_en is pulsed, it is not pulsed again for at least a predetermined period of time. For example, the bit counter 704 may wait at least a predetermined period of time between pulses of the latch signal latch_AFE_en. In some embodiments, the predetermined period of time may be in the order of hundreds or thousands of unit intervals (His), where a UI may represent a duration of one (1) bit of data in the serial data stream. For example, in embodiments in which the serial data stream operates at 10 Gbps, a UI may be 100 picoseconds, and the bit counter 704 may wait at least 100 nanoseconds between pulses of the latch signal latch_AFE_en. In some embodiments, this may allow the output of the filter 504 to accurately represent long term averages of the output voltages $V_{outp}$ and $V_{outn}$.

In some embodiments, a device including one or more of the elements discussed above may enter a special calibration mode that may be unrelated to calibration, but may nevertheless provide an opportunity to perform DC offset cancellation because the serial data stream is not received, or the serial data stream is received having a predetermined pattern. For example, serial data stream having a periodic pattern such as a 50% duty cycle may be received as part of a standard protocol during a power-on cycle of a chip included in such a device, and may be used for example to allow the CDR 206 to acquire a desired frequency and phase. Because a periodic pattern may be expected, and known in advance, it may be used by the elements discussed above to perform a fast offset correction procedure. For example, while the periodic pattern is received, the bit counter 704 may allow a shorter wait time between pulses of the latch signal latch_AFE_en, or for example may pulse the latch signal latch_AFE_en according to a predetermined pulse pattern that may correspond to the periodic pattern. After the period pattern stops, the bit counter 704 may operate as described above with respect to FIGS. 7-8.

Figure 9:
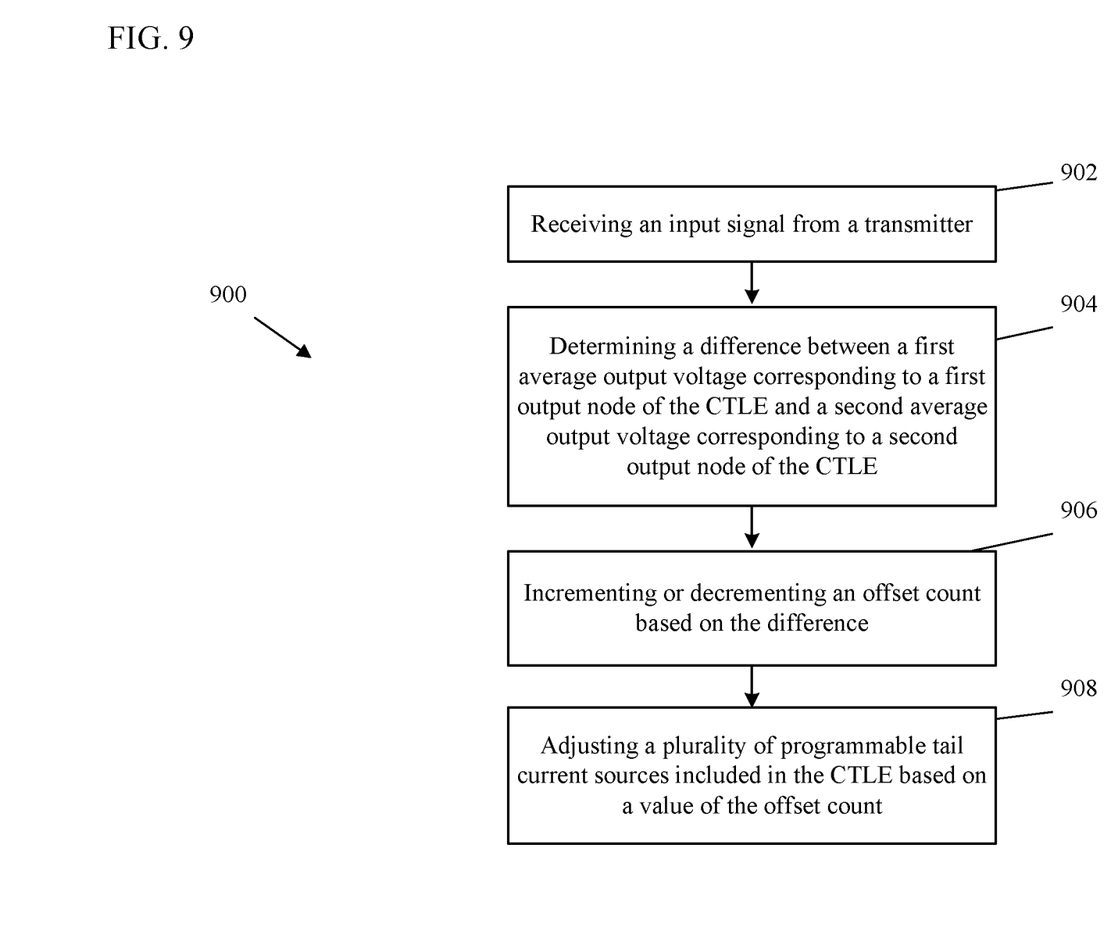
FIG. 9 is a flowchart of a method for adjusting a direct current (DC) offset in a continuous-time linear equalizer (CTLE) included in an analog front end (AFE) for a receiver of a serial data link, in accordance with some embodiments.

FIG. 9 is a flow chart of process 900 for adjusting a direct current (DC) offset in a continuous-time linear equalizer (CTLE) included in an analog front end (AFE) for a receiver of a serial data link, according to an embodiment. In some implementations, one or more process blocks of FIG. 9 may be performed by one or more of the elements discussed above, for example one or more of the AFE 202b and the elements included therein, the calibration counter 502 and the elements included therein, and the receiver 106c and the elements included therein.

As shown in FIG. 9, process 900 may include receiving an input signal from a transmitter (block 902). In embodiments, the transmitter may correspond to the transmitter 102 shown in FIG. 1.

As further shown in FIG. 9, process 900 may include determining a difference between a first average output voltage corresponding to a first output node of the CPI and a second average output voltage corresponding to a second output node of the CTLE (block 904). In embodiments, the first average output voltage and the second average output voltage may correspond to the filtered output voltages $V_{outp}$ and $V_{outn}$ shown in FIGS. 5 and 6.

As further shown in FIG. 9, process 900 may include incrementing or decrementing an offset count based on the difference (block 906). In embodiments, the offset count may correspond to the offset count discussed above with respect to FIGS. 5-8.

As further shown in FIG. 9, process 900 may include adjusting a plurality of programmable tail current sources included in the CTLE based on a value of the offset count (block 908). In embodiments, the plurality of programmable tail current sources may correspond to one or more of the tail current sources 308 and 310 and the tail current sources 506 and 508.

In embodiments, the value of the offset count may indicate an amount of a DC offset between the first output node and the second output node.

In embodiments, the adjusting of the plurality of programmable tail current sources may include adjusting an amount of a current passing through the plurality of programmable tail current sources based on the value of the offset count such that the amount of the DC offset is reduced.

In embodiments, the process 900 may further include counting a number of ones (1s) and a number of zeroes (0s) included in a deserialized signal corresponding to the input signal, and the plurality of programmable tail current sources may be adjusted based on the number of the ones (1s) being equal to the number of the zeroes (0s).

In embodiments, the process 900 may further include latching the value of the offset count based on the number of the ones (1s) being equal to the number of the zeroes (0s), and the plurality of programmable tail current sources may be adjusted based on the latched value of the offset count.

In embodiments, the process 900 may further include filtering the first average output voltage and the second average output voltage before determining the difference.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Accordingly, the above embodiments may provide an always-on offset correction loop that can work with random data streams thereby allowing the offset correction loop to run in the background and track time varying offsets.

The offset correction loop according to the above embodiments may also work with non DC-balanced bit-streams, for example by using a bit-counter to track a received number of ones (is) and zeros. In embodiments, the calibration signal may only be applied to the AFE when number of received ones (1s) and zeros (0s) are equal.

As discussed above, a DC offset can drift slowly due to temperature changes and other factors. Because the offset correction loop according to the above embodiments is always running, the offset correction loop may allow detection and correction of these slow DC drifts. In addition, because the offset correction loop may not require the addition of an element of a multiplexer in the high-speed data path, an overall bandwidth of the entire high-speed data path may increase.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term "component" is intended to be broadly construed as hardware, software, firmware, or a combination thereof.

It will be apparent that systems and/or methods, described herein, may be implemented in different forms of hardware, software, firmware, or a combination thereof. The actual specialized control hardware or software code used to implement these systems and/or methods is not limiting the implementations. Thus, the operation and behavior of the systems and/or methods were described herein without reference to specific software code it being understood that software and hardware may be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

While one or more exemplary embodiments have been described above with reference to the figures, it will be understood by those of ordinary skill in the art that various changes in form and details may be made therein without departing from the spirit and scope as defined at least in part by the following claims.

What is claimed is:

1. A receiver for a serial data link, comprising:
    an analog front end (AFE) comprising a continuous-time linear equalizer (CTLE) configured to receive an input signal from a transmitter, the CTLE comprising:
    a first output node;
    a second output node;
    a plurality of programmable tail current sources configured to adjust a direct current (DC) offset between the first output node and the second output node; and
    a calibration circuit which comprises:
        a slicer configured to output a difference between a first average output voltage corresponding to the first output node and a second average output voltage corresponding to the second output node; and
        a calibration counter configured to increment or decrement an offset count based on the difference,
    wherein the plurality of programmable tail current sources are adjusted based on a value of the offset count.

2. The receiver of claim 1, wherein the value of the offset count indicates an amount of the DC offset between the first output node and the second output node.

3. The receiver of claim 2, wherein, based on the value of the offset count, an amount of a current passing through the plurality of programmable tail current sources is adjusted such that the amount of the DC offset is reduced.

4. The receiver of claim 1, further comprising a bit counter configured to count a number of ones (1s) and a number of zeroes (0s) included in a deserialized signal corresponding to the input signal,
    wherein the plurality of programmable tail current sources is adjusted based on the number of the ones (1s) being equal to the number of the zeroes (0s).

5. The receiver of claim 4, further comprising a latch circuit which is configured to latch the value of the offset count based on a latch enable signal provided by the bit counter, and provide the latched value of the offset count to the plurality of programmable tail current sources,
    wherein the plurality of programmable tail current sources is adjusted based on the latched value of the offset count, and
    wherein the bit counter is further configured to pulse the latch enable signal based on the number of ones (1s) being equal to the number of zeroes (0s).

6. The receiver of claim 5, wherein the bit counter is further configured to wait at least a predetermined amount of time between subsequent pulses.

7. The receiver of claim 1, wherein the slicer comprises a one-bit analog-to-digital converter.

8. The receiver of claim 7, wherein the first average output voltage and the second average output voltage are filtered output voltages provided to the one-bit analog-to-digital converter.

9. A calibration circuit for calibrating a continuous-time linear equalizer (CTLE) included in an analog front end (AFE) for a receiver of a serial data link, the calibration circuit comprising:
    a slicer configured to output a difference between a first average output voltage corresponding to a first output node of the CTLE and a second average output voltage corresponding to a second output node of the CTLE;
    a calibration counter configured to increment or decrement an offset count based on the difference; and
    a latch circuit configured to latch the value of the offset count,
    wherein a plurality of programmable tail current sources of the CTLE are adjusted based on the latched value of the offset count.

10. The calibration circuit of claim 9, wherein the value of the offset count indicates an amount of a direct current (DC) offset between the first output node and the second output node.

11. The calibration circuit of claim 10, wherein an amount of a current passing through the plurality of programmable tail current sources is adjusted such that the amount of the DC offset is reduced.

12. The calibration circuit of claim 9, wherein the latch circuit is configured to:
    receive a latch enable signal from a bit counter;
    latch the value of the offset count based on the latch enable signal; and
    provide the latched value of the offset count to the CTLE.

13. The calibration circuit of claim 12, wherein the latch enable signal is received from the bit counter based on a number of ones (1s) and a number of zeroes (0s) included in a deserialized signal corresponding to an input signal received by the CTLE.

14. The calibration circuit of claim 13, wherein the latch enable signal is received from the bit counter based on the number of the ones (1s) being equal to the number of the zeroes (0s).

15. The calibration circuit of claim 9, wherein the slicer comprises a one-bit analog-to-digital converter.

16. The calibration circuit of claim 15, further comprising a filter configured to filter output voltages corresponding to the first and second output nodes, and provide the filtered output voltages to the one-bit analog-to-digital converter.

17. A method of adjusting a direct current (DC) offset in a continuous-time linear equalizer (CTLE) included in an analog front end (AFE) for a receiver of a serial data link, the method comprising:
receiving an input signal from a transmitter;
determining a difference between a first average output voltage corresponding to a first output node of the CTLE and a second average output voltage corresponding to a second output node of the CTLE;
incrementing or decrementing an offset count based on the difference; and
adjusting a plurality of programmable tail current sources included in the CTLE based on a value of the offset count to adjust the DC offset between the first and second output nodes of the CTLE.

18. The method of claim 17, wherein the value of the offset count indicates an amount of a DC offset between the first output node and the second output node.

19. The method of claim 18, wherein the adjusting of the plurality of programmable tail current sources comprises adjusting an amount of a current passing through the plurality of programmable tail current sources based on the value of the offset count such that the amount of the DC offset is reduced.

20. The method of claim 17, further comprising counting a number of ones (1s) and a number of zeroes (0s) included in a deserialized signal corresponding to the input signal,
wherein the plurality of programmable tail current sources is adjusted based on the number of the ones (1s) being equal to the number of the zeroes (0s).

21. The method of claim 20, further comprising latching the value of the offset count based on the number of the ones (1s) being equal to the number of the zeroes (0s),
wherein the plurality of programmable tail current sources is adjusted based on the latched value of the offset count.

22. The method of claim 17, further comprising filtering output voltages corresponding to the first and second output nodes to generate the first average output voltage and the second average output voltage before determining the difference.

* * * * *